United States Patent
Kim

(10) Patent No.: US 10,892,779 B2
(45) Date of Patent: Jan. 12, 2021

(54) ERROR CORRECTION DEVICE, OPERATING METHOD THEREOF AND ELECTRONIC DEVICE INCLUDING THE SAME

(71) Applicant: SK hynix Inc., Gyeonggi-do (KR)

(72) Inventor: Dae Sung Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 61 days.

(21) Appl. No.: 16/212,280

(22) Filed: Dec. 6, 2018

(65) Prior Publication Data

US 2020/0059244 A1    Feb. 20, 2020

(30) Foreign Application Priority Data

Aug. 17, 2018  (KR) .................. 10-2018-0096335

(51) Int. Cl.
```
H03M 13/00    (2006.01)
H03M 13/11    (2006.01)
G06F 11/10    (2006.01)
H03M 13/45    (2006.01)
```

(52) U.S. Cl.
CPC ..... *H03M 13/1171* (2013.01); *G06F 11/1076* (2013.01); *H03M 13/45* (2013.01)

(58) Field of Classification Search
None
See application file for complete search history.

(56) References Cited

U.S. PATENT DOCUMENTS

| | | | | |
|---|---|---|---|---|
| 8,694,868 | B1* | 4/2014 | Chilappagari | H03M 13/1108 714/752 |
| 2014/0258809 | A1* | 9/2014 | Nguyen | H03M 13/1111 714/763 |
| 2014/0281794 | A1* | 9/2014 | Sakaue | G06F 11/1012 714/758 |
| 2014/0289584 | A1* | 9/2014 | Chilappagari | G06F 11/1068 714/755 |
| 2020/0067538 | A1* | 2/2020 | Kim | H03M 13/611 |

FOREIGN PATENT DOCUMENTS

KR    1020140098702    8/2014

OTHER PUBLICATIONS

Andreas F. Molisch, "Channel Coding and Information Theory," in Wireless Communications , IEEE, 2011, pp. 277-317, doi: 10.1002/9781119992806.ch14. (Year: 2011).*

* cited by examiner

*Primary Examiner* — Daniel F. McMahon
(74) *Attorney, Agent, or Firm* — IP & T Group LLP

(57) ABSTRACT

An error correction device includes a bit reliability value determination circuit configured to determine bit reliability values corresponding to hard decision bits, based on soft decision bit sets corresponding to the hard decision bits; and a decoder including a variable node configured to receive and store the hard decision bits and the bit reliability values, and perform a decoding operation for the hard decision bits by restoring reliability values from the bit reliability values. The reliability values correspond to elements except a decision symbol configured by the hard decision bits, in a Galois field (GF) defined in the variable node. All necessary reliability values are not transmitted to each variable node, instead, compressed reliability values are transmitted to the variable node. The variable node receives and retains the compressed reliability values, restores necessary reliability values, and uses them in a decoding operation.

18 Claims, 5 Drawing Sheets

FIG.3A

|  | Elements of GF(4) | Bit reliability value | Reliability value |
|---|---|---|---|
| Decision symbol | HD1, HD2 | BRV1, BRV2 |  |
| E1 | /HD1, HD2 |  | BRV1 |
| E2 | HD1, /HD2 |  | BRV2 |
| E3 | /HD1, /HD2 |  | BRV1+BRV2 |

FIG.3B

|  | Elements of GF(8) | Bit reliability value | Reliability value |
|---|---|---|---|
| Decision symbol | HD11, HD12, HD13 | BRV11, BRV12, BRV13 |  |
| E11 | /HD11, HD12, HD13 |  | BRV11 |
| E12 | HD11, /HD12, HD13 |  | BRV12 |
| E13 | HD11, HD12, /HD13 |  | BRV13 |
| E14 | /HD11, /HD12, HD13 |  | BRV11+BRV12 |
| E15 | /HD11, HD12, /HD13 |  | BRV11+BRV13 |
| E16 | HD11, /HD12, /HD13 |  | BRV12+BRV13 |
| E17 | /HD11, /HD12, /HD13 |  | BRV11+BRV12+BRV13 |

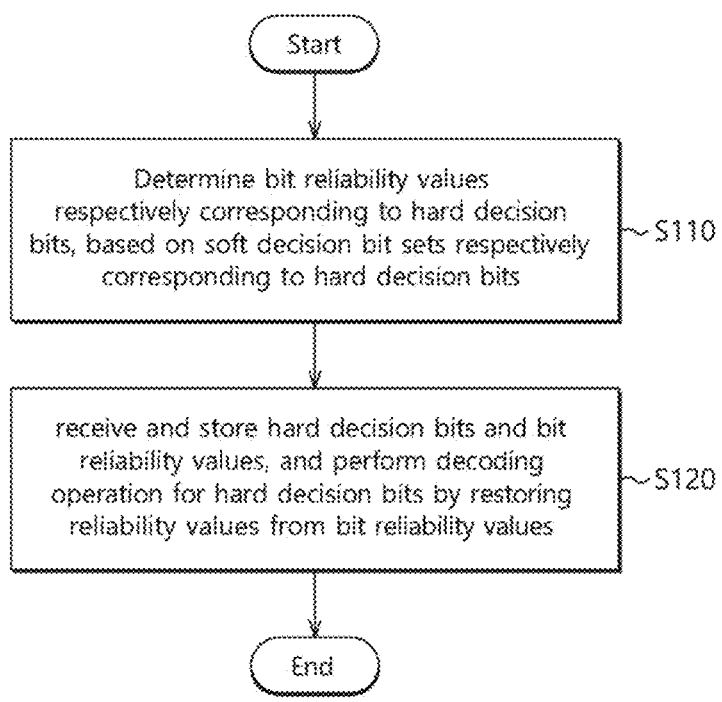

ERROR CORRECTION DEVICE, OPERATING METHOD THEREOF AND ELECTRONIC DEVICE INCLUDING THE SAME

CROSS-REFERENCES TO RELATED APPLICATION

The present application claims priority under 35 U.S.C. § 119(a) to Korean application number 10-2018-0096335 filed on Aug. 17, 2018, which is incorporated herein by reference in its entirety.

BACKGROUND

1. Technical Field

Various embodiments generally relate to an error correction device, and, more particularly, to an error correction device to which a non-binary low density parity check (LDPC) code is applied.

2. Related Art

Generally, a low density parity check (LDPC) code is classified into a binary LDPC code and a non-binary LDPC code. In the non-binary LDPC code, the element of a corresponding parity check matrix has a non-binary value. In a binary LDPC code, the element of a corresponding parity check matrix is 0 or 1, that is, has a binary value. For the non-binary LDPC code, a more complex computation may be performed and a larger storage space for computation may be required. In particular, when a decision symbol is configured by p number of bits, because a non-binary LDPC code is defined in $GF(2^p)$, a decoding operation is performed based on a plurality of reliability values in each variable node, unlike a binary LDPC code. As a result, a storage space for reliability values may be a concern.

Using an LDPC code, a decoder may perform an error correction operation for data read from a memory device. Thus, the reliability of a memory system including the memory device may be improved.

SUMMARY

In an embodiment, an error correction device may include: a bit reliability value determination circuit configured to determine bit reliability values respectively corresponding to hard decision bits, based on soft decision bit sets respectively corresponding to the hard decision bits; and a decoder including a variable node configured to receive and store the hard decision bits and the bit reliability values, and perform a decoding operation for the hard decision bits by restoring reliability values from the bit reliability values, wherein the reliability values respectively correspond to elements except a decision symbol configured by the hard decision bits, in a Galois field (GF) defined in the variable node.

In an embodiment, a method for operating an error correction device may include: determining bit reliability values respectively corresponding to hard decision bits, based on soft decision bit sets respectively corresponding to the hard decision bits; and receiving and storing, by a variable node, the hard decision bits and the bit reliability values, and performing a decoding operation for the hard decision bits by restoring reliability values from the bit reliability values, wherein the reliability values respectively correspond to elements except a decision symbol which is configured by the hard decision bits, in a Galois field (GF) defined in the variable node.

In an embodiment, the bit reliability values may be magnitudes of reliability values which are estimated as log-likelihood ratios respectively corresponding to the soft decision bit sets in GF(2).

In an embodiment, each of the bit reliability values may do not include a sign information.

In an embodiment, the determining of the bit reliability values may include determining the bit reliability values, by referring to a bit reliability value table including the bit reliability values respectively corresponding to the soft decision bit sets.

In an embodiment, the restoring of the reliability values may include restoring a sum of bit reliability values of one or more selected hard decision bits of the hard decision bits, as a reliability value corresponding to a first element among the elements, and the selected hard decision bits may be one or more bits which are different, when comparing the decision symbol with the first element by the unit of bit.

In an embodiment, each of the reliability values may be estimated as a log-likelihood ratio for the decision symbol and a corresponding element.

In an embodiment, the hard decision bits may satisfy an independent and identically distributed (IID) condition.

In an embodiment, the decoding operation may be performed based on a non-binary low density parity check (LDPC) code.

In an embodiment, an electronic device may include: a memory device including at least two memory cells, and configured to read hard decision bits and soft decision bit sets respectively corresponding to the hard decision bits from the memory cells; and an error correction circuit configured to perform a decoding operation for the hard decision bits, based on the soft decision bit sets, wherein the error correction circuit includes a bit reliability value determination circuit configured to determine bit reliability values respectively corresponding to the hard decision bits, based on the soft decision bit sets; and a decoder including a variable node configured to receive and store the hard decision bits and the bit reliability values, and perform the decoding operation for the hard decision bits by restoring reliability values from the bit reliability values, wherein the reliability values respectively correspond to elements except a decision symbol which is configured by the hard decision bits, in a Galois field (GF) defined in the variable node.

In an embodiment, an electronic device may include: a memory device including a plurality of memory cells, and configured to read a plurality of hard decision bits and a plurality of soft decision bit sets respectively corresponding to the hard decision bits from the memory cells; and an error correction circuit configured to perform a decoding operation for the hard decision bits, based on the soft decision bit sets, wherein the error correction circuit includes a bit reliability value determination circuit configured to determine bit reliability values respectively corresponding to the hard decision bits, based on the soft decision bit sets; and a decoder including a plurality of variable nodes which respectively receive a plurality of decision symbols into which the hard decision bits are grouped, wherein each variable node receives and stores bit reliability values corresponding to a received decision symbol, and performs a decoding operation for the decision symbol by restoring reliability values from the bit reliability values corresponding to the decision symbol, and wherein the reliability values respectively correspond to elements except the decision symbol, in a Galois field (GF) defined in the variable node.

In an embodiment, an error correction device may include: a bit reliability value determination circuit suitable for determining bit reliability values respectively corresponding to hard decision bits, based on soft decision bit sets; and a decoder configured to: receive the hard decision bits and the bit reliability values; and perform a decoding operation for the hard decision bits based on the bit reliability values to generate error-corrected bits, when the soft decision bit sets respectively correspond to the hard decision bits, and the bit reliability values include reliability values excluding sign information, corresponding to the soft decision bit sets.

BRIEF DESCRIPTION OF THE DRAWINGS

FIGS. 3A and 3B are diagrams illustrating a method in which reliability values are restored based on bit reliability values in accordance with an embodiment.

FIG. 7 is a flow chart illustrating a method for operating an error correction device or an error correction circuit in accordance with an embodiment.

DETAILED DESCRIPTION

Figure 1:
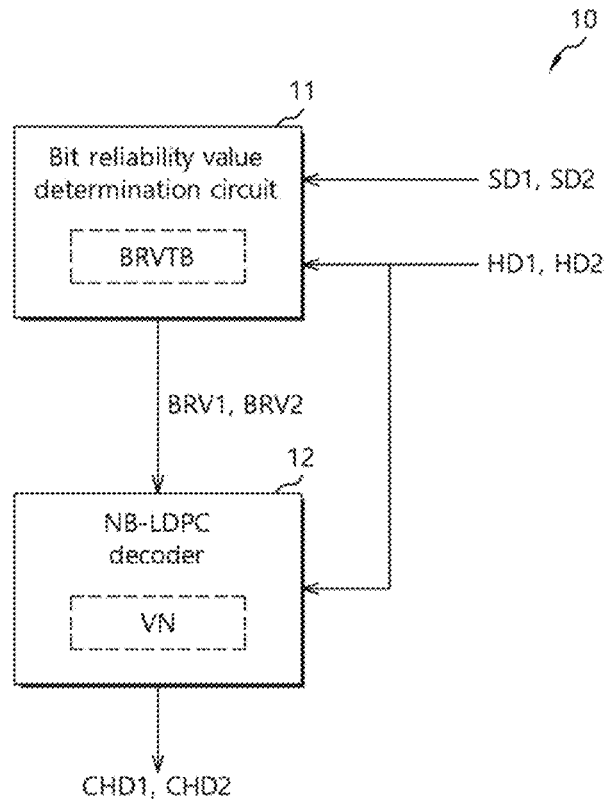
FIG. 1 is a block diagram illustrating an error correction device in accordance with an embodiment.

In the present disclosure, advantages, features and methods for achieving them will become more apparent after a reading of the following exemplary embodiments taken in conjunction with the accompanying drawings. The present disclosure may, however, be embodied in different forms and should not be construed as being limited to the embodiments set forth herein. Rather, these embodiments are provided to describe the present disclosure in detail to the extent that a person skilled in the art to which the disclosure pertains can easily carry out the technical ideas of the present disclosure.

It is to be understood herein that embodiments of the present disclosure are not limited to the particulars shown in the drawings and that the drawings are not necessarily to scale and in some instances proportions may have been exaggerated in order to more clearly depict certain features of the disclosure. While particular terminology is used herein, it is to be appreciated that the terminology used herein is for the purpose of describing particular embodiments only and is not intended to limit the scope of the present disclosure.

As used herein, the term "and/or" includes any and all combinations of one or more of the associated listed items. It will be understood that when an element is referred to as being "on," "connected to" or "coupled to" another element, it may be directly on, connected or coupled to the other element or intervening elements may be present. As used herein, a singular form is intended to include plural forms as well, unless the context clearly indicates otherwise. It will be further understood that the terms "includes" and/or "including," when used in this specification, specify the presence of at least one stated feature, step, operation, and/or element, but do not preclude the presence or addition of one or more other features, steps, operations, and/or elements thereof.

In a decoder using a non-binary LDPC code, each variable node may compute reliability values of a plurality of hard decision bits which configure a decision symbol, and may perform a decoding operation by exchanging the computed reliability values with one or more check nodes. When the number of hard decision bits is p, the decision symbol may be an element of GF($2^p$ or $2^p$). GF means a Galois field.

The number of reliability values to be used in each variable node may be ($2^p$)−1, unlike a binary LDPC code. The ($2^p$)−1 number of reliability values may respectively correspond to remaining ($2^p$)−1 number of elements other than the decision symbol in GF($2^p$). In detail, for an i-th variable node, the reliability value of an element β other than the decision symbol in GF($2^p$) may be determined based on the log-likelihood ratio (LLR) $L_{i,\beta}$ of the element β as expressed in the following Equation 1.

$$L_{i,\beta} = \log\left(\frac{Pr(y_i | d_i)}{Pr(y_i | \beta)}\right) \quad (1)$$

In Equation 1, $y_i$ is the output of a channel which is inputted to the i-th variable node, and $d_i$ is hard decision bits of the ith variable node, that is, a decision symbol. Since a probability $Pr(y_i|d_i)$ for the decision symbol is positioned at the numerator of the number of the log, the LLR value of Equation 1 is a positive number.

Meanwhile, because a computation is too complex when the LLR value according to Equation 1 is used as the reliability value of the decoder as it is, preselected integers may be used as a reliability value instead of the LLR value of Equation 1. That is, each reliability value to be used in the i-th variable node may be a value that is estimated as the LLR value of Equation 1 for a decision symbol and a corresponding element.

In the present disclosure to be described below, hard decision bits may satisfy an independent and identically distributed (IID) condition. Under the IID condition, in the present disclosure, all necessary reliability values are not transmitted to each variable node. Instead, reliability values may be compressed and compressed reliability values may be transmitted to the variable node. The variable node may receive and retain the compressed reliability values, and may restore necessary reliability values and use them in a decoding operation. As a consequence, according to the present disclosure, a storage capacity for reliability values may be substantially reduced in a decoder or a variable node, and due to this fact, a power consumption amount may be reduced.

Hereinafter, an error correction device, an operating method thereof and an electronic device including the same will be described below with reference to the accompanying drawings through various examples of embodiments.

FIG. 1 is a block diagram illustrating an error correction device 10 in accordance with an embodiment.

Referring to FIG. 1, the error correction device 10 may receive hard decision bits HD1 and HD2 and soft decision bit sets SD1 and SD2. The error correction device 10 may perform an error correction operation for the hard decision bits HD1 and HD2 based on a non-binary LDPC code, and may output error-corrected bits CHD1 and CHD2. The soft decision bit set SD1 may correspond to the hard decision bit HD1, and may be configured by one or more soft decision bits. The soft decision bit set SD2 may correspond to the hard decision bit HD2, and may be configured by one or more soft decision bits.

The hard decision bits HD1 and HD2 may configure a decision symbol which is to be inputted to any one variable node VN of a decoder 12. The decoder 12 may be a decoder using a non-binary LDPC (NB-LDPC) code. While descriptions to be made hereunder are exemplarily directed to any one variable node VN of the decoder 12, it is to be noted that they may be applied in the same manner to each of the other variable nodes (not shown) of the decoder 12. In other words, the error correction device 10 may receive a plurality of hard decision bits which are grouped into a plurality of decision symbols and soft decision bit sets which respectively correspond to the hard decision bits. The operating method of the error correction device 10 for each of the decision symbols may be substantially the same as an operating method for the hard decision bits HD1 and HD2.

While it is to be described that the decision symbol of the variable node VN is configured by two hard decision bits HD1 and HD2 and thus the error correction device 10 operates with a non-binary LDPC code which is defined in GF(4), it is to be noted that embodiments of the present disclosure are not limited thereto. Namely, even when a decision symbol is configured by p number of hard decision bits and the error correction device 10 operates with a non-binary LDPC code which is defined in $GF(2^p)$, the present disclosure may be applied in the same manner and may achieve a reduction in a storage capacity for reliability values.

The error correction device 10 may include a bit reliability value determination circuit 11 and the decoder 12.

The bit reliability value determination circuit 11 may determine bit reliability values BRV1 and BRV2 respectively corresponding to the hard decision bits HD1 and HD2, based on the soft decision bit sets SD1 and SD2. Further, the bit reliability value determination circuit 11 may output the determined bit reliability values BRV1 and BRV2 to the decoder 12. The bit reliability value determination circuit 11 may refer to a bit reliability value table BRVTB to determine the bit reliability values BRV1 and BRV2.

The bit reliability value table BRVTB may include bit reliability values respectively corresponding to all values which may be inputted as the soft decision bit sets SD1 and SD2. Therefore, the bit reliability value determination circuit 11 may determine the bit reliability values BRV1 and BRV2 which respectively correspond to the soft decision bit sets SD1 and SD2, by referring to the bit reliability value table BRVTB. In the present disclosure, all the bit reliability values BRV1 and BRV2 may be positive numbers. For example, the bit reliability values BRV1 and BRV2 may be the magnitudes of reliability values which are estimated as LLR values respectively corresponding to the soft decision bit sets SD1 and SD2 in GF(2).

That is, as will be demonstrated below, in the present disclosure, since the bit reliability values BRV1 and BRV2 are fixed to positive numbers, the bit reliability value table BRVTB need not include the sign information of all bit reliability values. Also, since the number of bit reliability values of the bit reliability value table BRVTB is computed on GF(2), it may be less than the number of reliability values which is computed on $GF(2^p)$ where p is not 1. Thus, the capacity of the bit reliability value table BRVTB may be greatly reduced.

The decoder 12 may perform a decoding operation for the hard decision bits HD1 and HD2 based on the bit reliability values BRV1 and BRV2 according to a non-binary LDPC code, and may output the error-corrected bits CHD1 and CHD2. In detail, the hard decision bits HD1 and HD2 and the bit reliability values BRV1 and BRV2 may be inputted to the corresponding variable node VN in the decoder 12. The variable node VN may restore reliability values based on the bit reliability values BRV1 and BRV2, and may perform the decoding operation by using the restored reliability values. In this regard, since the variable node VN stores the bit reliability values BRV1 and BRV2 which do not include signs, a storage capacity for reliability values may be reduced.

Figure 2:
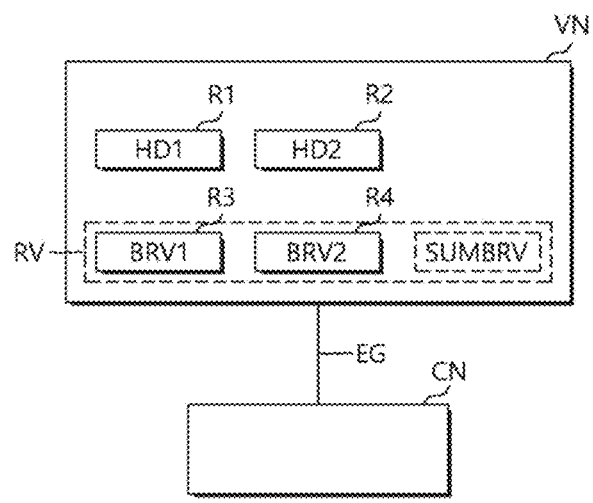
FIG. 2 is a diagram illustrating a method in which reliability values are restored from bit reliability values in a variable node in accordance with an embodiment.

FIG. 2 is a diagram illustrating a method in which reliability values RV are restored from the bit reliability values BRV1 and BRV2 in the variable node VN in accordance with an embodiment. Each variable node included in the decoder 12 may operate substantially similarly to the variable node VN of FIG. 2.

Referring to FIG. 2, the hard decision bits HD1 and HD2 and the bit reliability values BRV1 and BRV2 may be inputted to and stored in the variable node VN. The hard decision bits HD1 and HD2 and the bit reliability values BRV1 and BRV2 may be stored in registers R1 to R4.

Based on the parity check matrix of a non-binary LDPC code which is applied to the decoder 12 of FIG. 1, the variable node VN may be coupled with a check node CN by an edge EG. While FIG. 2 illustrates only one check node CN which is coupled with the variable node VN, the variable node VN may be coupled with a plurality of check nodes depending on a parity check matrix.

The variable node VN may repeat the iteration of the decoding operation by restoring the reliability values RV from the bit reliability values BRV1 and BRV2, and exchanging computed values based on the reliability values RV with the check node CN. The reliability values RV may include the bit reliability values BRV1 and BRV2, and may include a sum SUMBRV of the bit reliability values BRV1 and BRV2. For example, the variable node VN may compute an extrinsic information on the check node CN and the reliability values RV, and may transmit a computed value to the check node VN. A manner in which the decoder 12 performs a decoding operation by using the reliability values RV may be according to the conventional art, and thus detailed descriptions thereof will be omitted herein.

The reliability values RV which are to be actually used in the decoding operation in the variable node VN may be regarded as being compressed and stored as the bit reliability values BRV1 and BRV2. While the iteration of the decoding operation is repeated, the variable node VN may retain only the bit reliability values BRV1 and BRV2 in the registers R3 and R4. Since the bit reliability values BRV1 and BRV2 are positive numbers, the reliability values RV are also positive numbers, and thus, the variable node VN need not separately retain sign information even on the reliability values RV. Generally, sign information for distinguishing whether reliability values to be used in a decoder are positive numbers or negative numbers should be separately retained. However, according to the present disclosure, it is not necessary to retain sign information.

Hereunder, the reason why the reliability values of the i-th variable node of the decoder 12 may be compressed into bit reliability values of hard decision bits which configure a decision symbol will be mathematically demonstrated from Equation 1. Hereunder, $y_i$ is the output of a channel which is inputted to the i-th variable node, $d_i$ is the hard decision bits of the i-th variable node, $d_{i,j}$ is a j-th bit of $d_i$, and $\beta_j$ is a j-th bit of the element $\beta$ which is not a decision symbol.

$$L_{i,\beta} = \log\left(\frac{Pr(y_i \mid d_i)}{Pr(y_i \mid \beta)}\right) = \log\left(\frac{Pr(d_i \mid y_i)}{Pr(\beta \mid y_i)}\right) = \log\left(\frac{\prod_{j=1}^{p} Pr(d_{i,j} \mid y_i)}{\prod_{j=1}^{p} Pr(\beta_j \mid y_i)}\right) = \sum_{j=1}^{p} l_{i,j}.$$

$$l_{i,j} = \log\left(\frac{Pr(d_{i,j} \mid y_i)}{Pr(\beta_j \mid y_i)}\right) = \log\left(\frac{Pr(y_i \mid d_{i,j})}{Pr(y_i \mid \beta_j)}\right).$$

In the above equation, when $d_{i,j}=\beta_j$, $l_{i,j}=0$, and, when $d_{i,j}\neq\beta_j$, $l_{i,j}>0$.

Therefore, $L_{i,\beta}=\Sigma_{j=1;d_{i,j}\neq\beta_j}^{P} l_{i,j}$.

That is, $l_{i,j}$ is an LLR value on GF(2), of each hard decision bit configuring the decision symbol. As can be seen in the above equation, $l_{i,j}$ is a positive number.

According to the above demonstration, an LLR value corresponding to an element which is other than the decision symbol on GF(2^p) is the sum of the magnitudes of LLR values of one or more selected hard decision bits. The one or more selected hard decision bits are one or more bits which are different, when comparing the decision symbol and the corresponding element in a bitwise manner, that is, by the unit of bit.

As the LLR values of hard decision bits, reliability values of integers may be used. Therefore, the sum of the magnitudes of reliability values of the one or more selected hard decision bits, that is, bit reliability values, may be used as a reliability value corresponding to an element which is other than the decision symbol on GF(2^p). The one or more selected hard decision bits are one or more bits which are different, when comparing the decision symbol and the corresponding element by the unit of bit.

FIGS. 3A and 3B are diagrams illustrating a method in which reliability values are restored based on bit reliability values in accordance with an embodiment. For example, FIG. 3A illustrates the case of GF(4), and FIG. 3B illustrates the case of GF(8).

Referring to FIG. 3A, two hard decision bits HD1 and HD2 may configure a decision symbol which is inputted to one variable node VN. The bit reliability value determination circuit 11 of FIG. 1 may determine bit reliability values BRV1 and BRV2 of the hard decision bits HD1 and HD2. Further, the bit reliability value determination circuit 11 may transmit the determined bit reliability values BRV1 and BRV2 to a corresponding variable node of the decoder 12.

The variable node VN of the decoder 12 may restore reliability values respectively corresponding to elements E1 to E3 except the decision symbol on GF(4), based on the bit reliability values BRV1 and BRV2, and may use the restored reliability values in a decoding operation. In the elements E1 to E3, the symbol '/' before hard decision bits HD1 and HD2 means the inverted value of a corresponding hard decision bit.

In detail, regarding the element E1, when bitwise comparing the hard decision bit HD1 of the decision symbol with the element E1, it may be a different value. Therefore, the bit reliability value BRV1 of the hard decision bit HD1, i.e., (BRV1), may become a reliability value corresponding to the element E1.

Regarding the element E2, when bitwise comparing the hard decision bit HD2 of the decision symbol with the element E2, it may be a different value. Therefore, the bit reliability value BRV2 of the hard decision bit HD2, i.e., (BRV2), may become a reliability value corresponding to the element E2.

Regarding the element E3, when bitwise comparing the hard decision bits HD1 and HD2 of the decision symbol with the element E3, they may be different values. Therefore, the sum of the bit reliability values BRV1 and BRV2 of the hard decision bits HD1 and HD2, i.e., (BRV1+BRV2), may become a reliability value corresponding to the element E3.

Referring to FIG. 3B, three hard decision bits HD11, HD12 and HD13 may configure a decision symbol which is inputted to one variable node VN. The bit reliability value determination circuit 11 of FIG. 1 may determine bit reliability values BRV11, BRV12 and BRV13 of the respective hard decision bits HD11, HD12 and HD13, and may transmit the determined bit reliability values to a corresponding variable node of the decoder 12.

The variable node VN of the decoder 12 may restore reliability values respectively corresponding to elements E11 to E17 except the decision symbol on GF(8), based on the bit reliability values BRV11, BRV12 and BRV13, and may use the restored reliability values in a decoding operation. In the elements E11 to E17, the symbol '/' before hard decision bits HD11, HD12 and HD13 means the inverted value of a corresponding hard decision bit.

In detail, regarding the element E11, when bitwise comparing the hard decision bit HD11 of the decision symbol with the element E11, it may be a different value. Therefore, the bit reliability value BRV11 of the hard decision bit HD11, i.e., (BRV11), may become a reliability value corresponding to the element E11. Since a method of generating reliability values corresponding to the elements E12 and E13 is the same as the method for the element E11, detailed descriptions thereof will be omitted herein.

Regarding the element E14, when bitwise comparing the hard decision bits HD11 and HD12 of the decision symbol with the element E14, they may be different values. Therefore, the sum of the bit reliability values BRV11 and BRV12 of the hard decision bits HD11 and HD12, i.e., (BRV11+BRV12), may become a reliability value corresponding to the element E14. Since a method of generating reliability values corresponding to the elements E15 and E16 is the same as the method for the element E14, detailed descriptions thereof will be omitted herein.

Regarding the element E17, when bitwise comparing the hard decision bits HD11, HD12 and HD13 of the decision symbol with the element E17, they may be different values. Therefore, the sum of the bit reliability values BRV11, BRV12 and BRV13 of the hard decision bits HD11, HD12 and HD13, i.e., (BRV11+BRV12+BRV13), may become a reliability value corresponding to the element E17.

When a decision symbol is configured by p number of hard decision bits, reliability values are restored from p number of bit reliability values respectively corresponding to the hard decision bits, and a method thereof is the same as the method described above with reference to FIGS. 3A and 3B.

Figure 4:
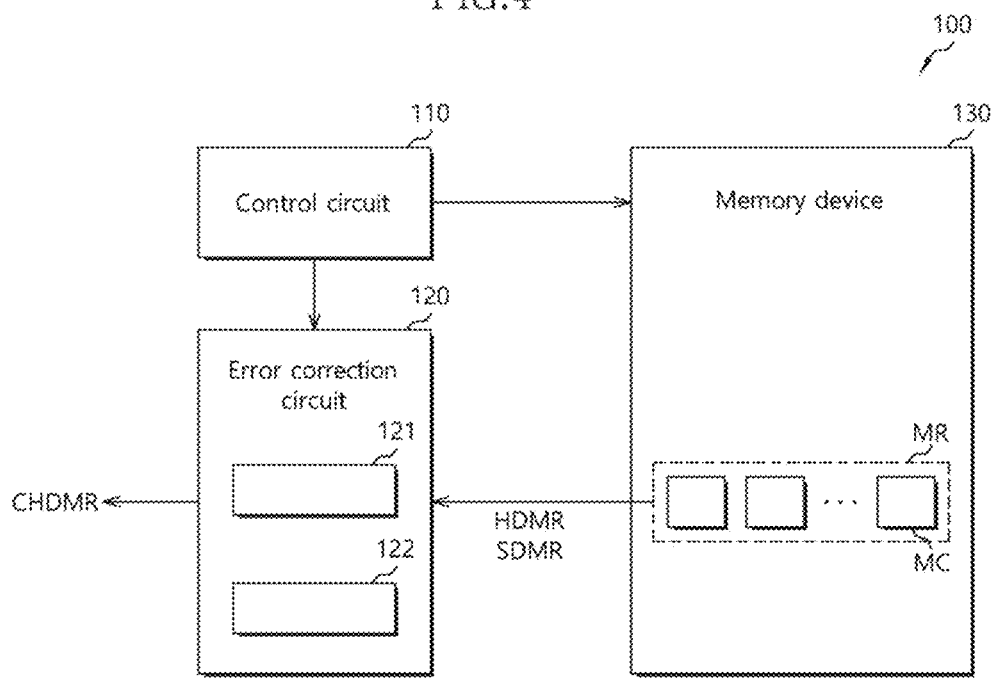
FIG. 4 is a block diagram illustrating an electronic device in accordance with an embodiment.

FIG. 4 is a block diagram illustrating an electronic device 100 in accordance with an embodiment.

Referring to FIG. 4, the electronic device 100 may include a control circuit 110, an error correction circuit 120 and a memory device 130.

The control circuit 110 may control the error correction circuit 120 and the memory device 130. The control circuit 110 may control the memory device 130 to store data in a memory region MR of the memory device 130 and read data stored in the memory region MR. Data stored in the memory region MR may be read as hard decision data HDMR and be provided to the error correction circuit 120. The hard decision data HDMR may be data read as one or more hard read voltages are applied to memory cells MC of the memory region MR. The hard decision data HDMR may include hard decision bits which are read from the memory cells MC, respectively.

The control circuit 110 may control the memory device 130 to read soft decision data SDMR from the memory region MR and provide the soft decision data SDMR to the error correction circuit 120. The soft decision data SDMR may be data read as one or more soft read voltages are applied to the memory cells MC of the memory region MR. The soft read voltages may be voltages which differ from the hard read voltages by predetermined offset values, respectively. The soft decision data SDMR may include soft decision bit sets which are read from the memory cells MC, respectively.

The error correction circuit 120 may perform an error correction operation based on the hard decision data HDMR and the soft decision data SDMR, and may output error-corrected data CHDMR. The error correction circuit 120 may include a bit reliability value determination circuit 121 and a decoder 122. The bit reliability value determination circuit 121 and the decoder 122 may be configured and operate in substantially the same manner as the bit reliability value determination circuit 11 and the decoder 12 of FIG. 1, respectively.

While not shown, the bit reliability value determination circuit 121 may refer to a bit reliability value table which is similar to the bit reliability value table BRVTB of FIG. 1. For example, the bit reliability value table may be stored in an internal nonvolatile memory (not shown) of the bit reliability value determination circuit 121. Alternatively, the bit reliability value table may be stored in the memory device 130, and may be read to the bit reliability value determination circuit 121 in case of need.

The memory device 130 may include the memory region MR capable of storing data. The data stored in the memory region MR may be an encoded codeword. The memory device 130 may read the hard decision data HDMR by applying one or more hard read voltages to the memory region MR under the control of the control circuit 110. The memory device 130 may read the soft decision data SDMR by applying one or more soft read voltages to the memory region MR under the control of the control circuit 110.

The memory region MR may include the plurality of memory cells MC. The memory cells MC may be coupled to the same word line. The memory cells MC may be simultaneously accessed when the memory device 130 performs a write operation or a read operation.

In the present disclosure, a decision symbol which is inputted to each variable node of the decoder 122, that is, p number of hard decision bits, may satisfy the independent and identically distributed (IID) condition. Thus, the p number of hard decision bits of the decision symbol may be bits which are read from different memory cells MC, respectively, in the memory region MR. That is, each of decision symbols which are respectively inputted to the variable nodes of the decoder 122 may be a group of p number of hard decision bits of the hard decision data HDMR.

The memory device 130 may include a volatile memory device and a nonvolatile memory device. The volatile memory device may be a dynamic random access memory (DRAM) or a static random access memory (SRAM). The nonvolatile memory device may be a flash memory device such as a NAND flash or a NOR flash, a ferroelectric random access memory (FRAM), a phase change random access memory (PCRAM), a magnetic random access memory (MRAM) or a resistive random access memory (ReRAM or RRAM).

Figure 5:
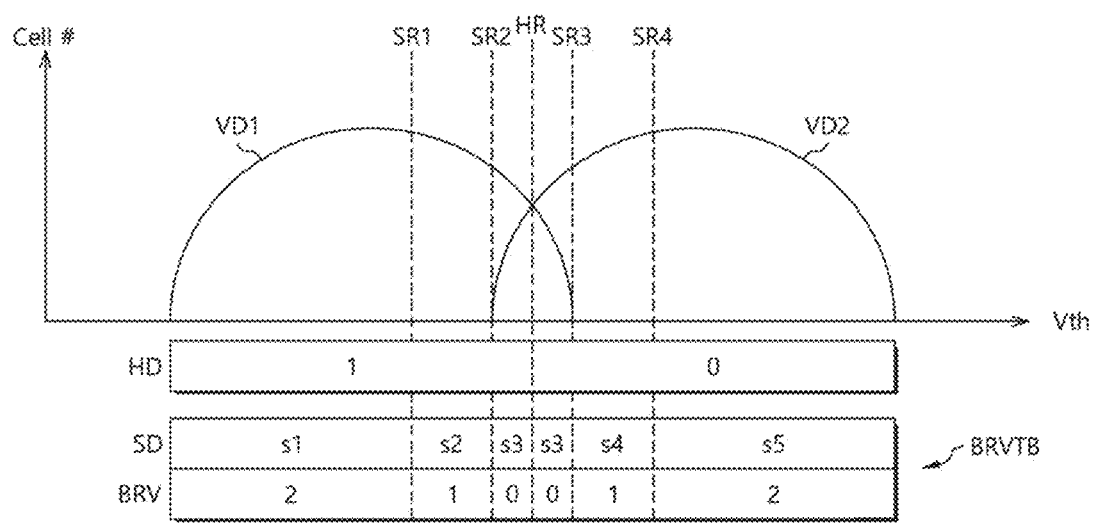
FIG. 5 is a diagram illustrating an example of a bit reliability value table which is referred to by a bit reliability value determination circuit in accordance with the embodiment.

FIG. 5 is a diagram illustrating a bit reliability value table in accordance with the embodiment, for example, a bit reliability value table BRVTB which is referred to by the bit reliability value determination circuit 121 of FIG. 4. Also, FIG. 5 illustrates threshold voltage distributions VD1 and VD2 which are formed by the memory cells MC when the memory device 130 of FIG. 4 is a NAND flash memory device.

Referring to FIG. 5, a memory cell MC in which data "1" is stored may be included in the threshold voltage distribution VD1. A memory cell MC in which data "0" is stored may be included in the threshold voltage distribution VD2.

If the threshold voltage distributions VD1 and VD2 are clearly separated based on a hard read voltage HR, when the hard read voltage HR is applied to the memory cells MC, the data stored in the memory cells MC may be read without an error. However, as shown, the threshold voltage distributions VD1 and VD2 may overlap with each other in the vicinity of the hard read voltage HR. Therefore, a memory cell MC which has a threshold voltage less than the hard read voltage HR may output "1" as a hard decision bit HD even though "0" is actually stored therein. Also, a memory cell MC which has a threshold voltage greater than the hard read voltage HR may output "0" as the hard decision bit HD even though "1" is actually stored therein. That is, when a memory cell MC is positioned in an area where the threshold voltage distributions VD1 and VD2 overlap with each other, the reliability of the hard decision bit HD which is read from the memory cell MC may be low.

Therefore, a memory cell MC which is precisely positioned in the threshold voltage distributions VD1 and VD2 may be determined as a soft decision bit set SD. The soft decision bit set SD may be read depending on the threshold voltage of each memory cell MC when soft read voltages SR1 to SR4 are applied to the memory cells MC. For example, when the threshold voltage of a memory cell MC is greater than the soft read voltage SR1 and less than the soft read voltage SR2, the soft decision bit set SD may be read as "s2" from the corresponding memory cell MC. As a result, the soft decision bit set SD may mean how closely or distantly a memory cell MC is positioned to or from the area where the threshold voltage distributions VD1 and VD2 overlap with each other, and this may mean the reliability of the hard decision bit HD.

The soft read voltages SR1 to SR4 may be voltages which are separated by predetermined offset values from the hard read voltage HR. Since four soft read voltages SR1 to SR4 are applied to the memory cells MC, the soft decision bit set SD which is read from a corresponding memory cell MC may be configured by four soft decision bits. In FIG. 5, the number of the soft read voltages SR1 to SR4 is exemplary.

The bit reliability value table BRVTB may include all possible values of the soft decision bit set SD, that is, "s1" to "s5," and a bit reliability value BRV corresponding to each soft decision bit set SD. The bit reliability value BRV may be the magnitude of a reliability value which is estimated as a log-likelihood ratio (LLR) value corresponding to the soft decision bit set SD in GF(2). Thus, the bit reliability value BRV of the bit reliability value table BRVTB is a positive number. The bit reliability value BRV shown in FIG. 5 is exemplary.

For example, if the hard decision bit HD is read as "1" and the soft decision bit set SD is read as "s2" from a memory cell MC, the bit reliability value determination circuit 121 may allocate the bit reliability value BRV of "1" corresponding to the soft decision bit set SD of "s2," to the corresponding hard decision bit HD, by referring to the bit reliability value table BRVTB.

Referring to the bit reliability value table BRVTB, when the soft decision bit set SD is "s3," the bit reliability value BRV may be determined as "0" regardless of whether the hard decision bit HD is "1" or "0." In this case, the bit reliability value determination circuit 121 may not receive the hard decision bit HD.

According to an embodiment, when the soft decision bit set SD is "s3," the bit reliability value BRV may be differently determined depending on whether the hard decision bit HD is "1" or "0." In this case, the bit reliability value determination circuit 121 may determine the bit reliability value BRV based on a corresponding hard decision bit HD and a corresponding soft decision bit SD in the bit reliability value table BRVTB.

Figure 6:
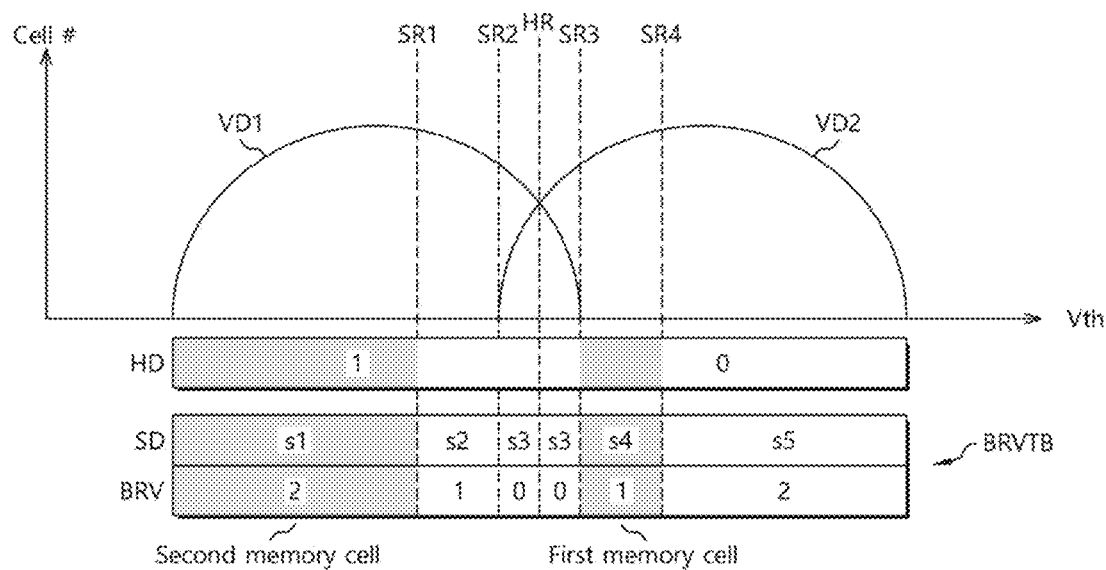
FIG. 6 is a diagram illustrating a method for operating an error correction circuit in accordance with an embodiment.
Figure 6:
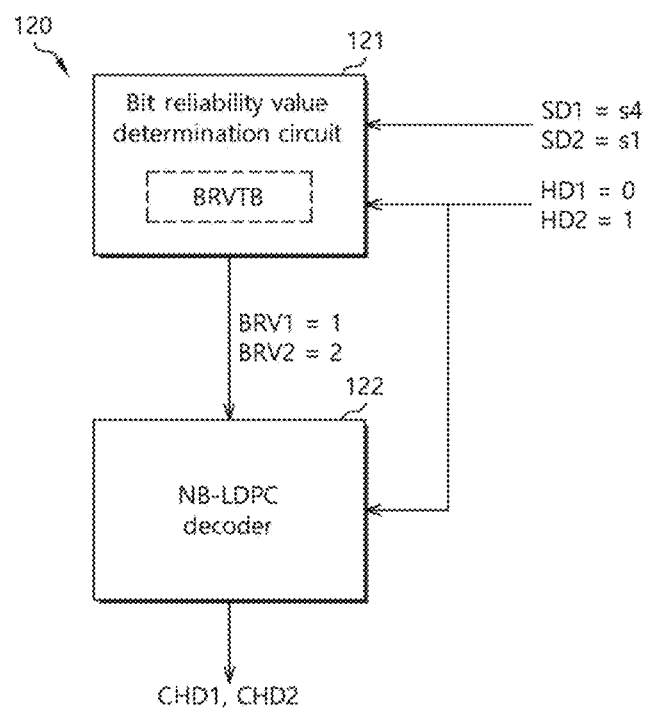

FIG. 6 is a diagram illustrating a method for operating an error correction circuit in accordance with an embodiment, for example, the error correction circuit 120 of FIG. 4. In FIG. 6, a decision symbol which is inputted to each of variable nodes of the decoder 122 is configured by two hard decision bits.

Referring to FIG. 6, hard decision bits HD1 and HD2 which are read from first and second memory cells may configure a decision symbol which is to be inputted to any one variable node. For example, the hard decision bit HD1 may be read as "0" from the first memory cell, and the hard decision bit HD2 may be read as "1" from the second memory cell.

The first memory cell may have a threshold voltage, for example, between soft read voltages SR3 and SR4. Therefore, a soft decision bit set SD1 may be read as "s4" from the first memory cell.

The second memory cell may have a threshold voltage, for example, less than or equal to a soft read voltage SR1. Therefore, a soft decision bit set SD2 may be read as "s1" from the second memory cell.

The bit reliability value determination circuit 121 may receive the hard decision bits HD1 and HD2 and the soft decision bit sets SD1 and SD2. The bit reliability value determination circuit 121 may refer to a bit reliability value table BRVTB to generate bit reliability values BRV1 and BRV2 of the hard decision bits HD1 and HD2. The bit reliability value determination circuit 121 may determine the bit reliability value BRV1 of the hard decision bit HD1 "0," as "1" corresponding to the soft decision bit set SD1 "s4." The bit reliability value determination circuit 121 may determine the bit reliability value BRV2 of the hard decision bit HD2 "1," as "2" corresponding to the soft decision bit set SD2 "s1."

The decoder 122 may perform a decoding operation by receiving the hard decision bits HD1 and HD2 and the bit reliability values BRV1 and BRV2, and may output error-corrected bits CHD1 and CHD2. The hard decision bits HD1 and HD2 and the bit reliability values BRV1 and BRV2 may be inputted to and stored in a corresponding variable node of the decoder 122.

The variable node may restore reliability values based on the bit reliability values BRV1 and BRV2, and may transmit the reliability values to one or more check nodes which are coupled by edges. The restored reliability values may be configured by the bit reliability values BRV1 and BRV2 and the sum of the bit reliability values BRV1 and BRV2. The restored reliability values may respectively correspond to elements "11," "00" and "10" except the decision symbol "01" in GF(4).

The restored reliability values may be determined as follows, by matching them to the elements "11," "00" and "10" (i.e., E1, E2 and E3) of GF(4) according to the method described above with reference to FIG. 3A. First, the bit reliability value BRV1 "1" of the hard decision bit HD1 "0" may become a reliability value corresponding to the element "11" (i.e., E1). The bit reliability value BRV2 "2" of the hard decision bit HD2 "1" may become a reliability value corresponding to the element "00" (i.e., E2). The sum "3" of the bit reliability values BRV1 and BRV2 may become a reliability value corresponding to the element "10" (i.e., E3).

FIG. 7 is a flow chart illustrating a method for operating an error correction device or an error correction circuit in accordance with an embodiment, for example, the error correction device 10 of FIG. 1 or the error correction circuit 120 of FIG. 4. In the following descriptions, a bit reliability value determination circuit may be the bit reliability value determination circuit 11 of FIG. 1 or the bit reliability value determination circuit 121 of FIG. 4. A decoder may be the decoder 12 of FIG. 1 or the decoder 122 of FIG. 4.

Referring to FIG. 7, at step S110, a bit reliability value determination circuit may determine bit reliability values respectively corresponding to hard decision bits, based on soft decision bit sets respectively corresponding to the hard decision bits. The bit reliability values may be the magnitudes of reliability values which are estimated as log-likelihood ratios (LLRs) respectively corresponding to the soft decision bit sets in GF(2). Each of the bit reliability values may not include a sign information. The bit reliability value determination circuit may determine the bit reliability values respectively corresponding to the hard decision bits, by referring to a bit reliability value table including bit reliability values respectively corresponding to soft decision bit sets.

At step S120, a variable node of a decoder may receive and store the hard decision bits and the bit reliability values from the bit reliability value determination circuit. Further, the variable node may perform a decoding operation for the hard decision bits, by restoring the reliability values from the bit reliability values. The reliability values may respectively correspond to elements except the decision symbol which is configured by the hard decision bits, in a Galois field (GF) defined in the variable node.

In detail, the variable node may restore the sum of bit reliability values of one or more selected hard decision bits among hard decision bits, as a reliability value corresponding to a first element among elements. The selected hard decision bits may be one or more bits which are different, when comparing the decision symbol with the first element by the unit of bit. Each of the reliability values may be used in the decoding operation by being estimated as a log-likelihood ratio (LLR) for the decision symbol and a corresponding element.

While various embodiments have been described above, it will be understood to those skilled in the art that the embodiments described are examples only. Accordingly, the error correction device, the operating method thereof and the electronic device including the same described herein should not be limited based on the described embodiments.

What is claimed is:

1. An error correction device comprising:
    a bit reliability value determination circuit configured to
        determine bit reliability values corresponding to hard decision bits, based on soft decision bit sets corresponding to the hard decision bits; and
a decoder including a variable node configured to receive and store the hard decision bits and the bit reliability values, and perform a decoding operation for the hard decision bits by restoring reliability values from the bit reliability values,
wherein the reliability values correspond to elements except a same element as a decision symbol configured by the hard decision bits, in a Galois field (GF) defined in the variable node.

2. The error correction device according to claim 1, wherein the bit reliability values are magnitudes of reliability values estimated as log-likelihood ratios corresponding to the soft decision bit sets in GF(2).

3. The error correction device according to claim 1, wherein each of the bit reliability values does not include a sign information.

4. The error correction device according to claim 1, wherein the bit reliability value determination circuit determines the bit reliability values, by referring to a bit reliability value table including the bit reliability values corresponding to the soft decision bit sets.

5. The error correction device according to claim 1,
wherein the variable node restores a sum of bit reliability values of one or more selected hard decision bits of the hard decision bits, as a reliability value corresponding to a first element among the elements, and
wherein the selected hard decision bits are one or more hard decision bits which are different from corresponding bits of the first element, when comparing the decision symbol with the first element by the unit of bit.

6. The error correction device according to claim 1, wherein each of the reliability values is estimated as a log-likelihood ratio for the decision symbol and a corresponding element.

7. The error correction device according to claim 1, wherein the hard decision bits satisfy an independent and identically distributed (IID) condition.

8. The error correction device according to claim 1, wherein the decoder performs the decoding operation based on a non-binary low density parity check (LDPC) code.

9. An electronic device comprising:
a memory device including at least two memory cells, and configured to read hard decision bits and soft decision bit sets corresponding to the hard decision bits from the memory cells; and
an error correction circuit configured to perform a decoding operation for the hard decision bits, based on the soft decision bit sets,
wherein the error correction circuit comprises
a bit reliability value determination circuit configured to determine bit reliability values corresponding to the hard decision bits, based on the soft decision bit sets; and
a decoder including a variable node configured to receive and store the hard decision bits and the bit reliability values, and perform the decoding operation for the hard decision bits by restoring reliability values from the bit reliability values,
wherein the reliability values correspond to elements except a same element as a decision symbol which is configured by the hard decision bits, in a Galois field (GF) defined in the variable node.

10. The electronic device according to claim 9, wherein the bit reliability values are magnitudes of reliability values which are estimated as log-likelihood ratios corresponding to the soft decision bit sets in GF(2).

11. The electronic device according to claim 9, wherein each of the bit reliability values does not include a sign information.

12. The electronic device according to claim 9, wherein the bit reliability value determination circuit determines the bit reliability values, by referring to a bit reliability value table including the bit reliability values corresponding to the soft decision bit sets.

13. The electronic device according to claim 9,
wherein the variable node restores a sum of bit reliability values of one or more selected hard decision bits of the hard decision bits, as a reliability value corresponding to a first element among the elements, and
wherein the selected hard decision bits are one or more hard decision bits which are different from corresponding bits of the first element, when comparing the decision symbol with the first element by the unit of bit.

14. The electronic device according to claim 9, wherein each of the reliability values is estimated as a log-likelihood ratio for the decision symbol and a corresponding element.

15. The electronic device according to claim 9, wherein the hard decision bits satisfy an independent and identically distributed (IID) condition.

16. The electronic device according to claim 9, wherein the memory cells are coupled to the same word line.

17. The electronic device according to claim 9, wherein the decoder performs the decoding operation based on a non-binary low density parity check (LDPC) code.

18. An electronic device comprising:
a memory device including a plurality of memory cells, and configured to read a plurality of hard decision bits and a plurality of soft decision bit sets corresponding to the hard decision bits from the memory cells; and
an error correction circuit configured to perform a decoding operation for the hard decision bits, based on the soft decision bit sets,
wherein the error correction circuit comprises
a bit reliability value determination circuit configured to determine bit reliability values corresponding to the hard decision bits, based on the soft decision bit sets; and
a decoder including a plurality of variable nodes which receive a plurality of decision symbols into which the hard decision bits are grouped,
wherein each variable node receives and stores bit reliability values corresponding to hard decision bits of a received decision symbol, and performs a decoding operation for the decision symbol by restoring reliability values from the stored bit reliability values, and
wherein the reliability values correspond to elements except a same element as the decision symbol, in a Galois field (GF) defined in the variable node.

* * * * *